United States Patent
Raad

(12) 
(10) Patent No.: US 6,320,809 B1
(45) Date of Patent: Nov. 20, 2001

(54) LOW VOLTAGE LEVEL POWER-UP DETECTION CIRCUIT

(75) Inventor: George B. Raad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/610,373

(22) Filed: Jul. 5, 2000

(51) Int. Cl.[7] .................................... G11C 7/00
(52) U.S. Cl. ............................ 365/226; 327/143
(58) Field of Search ..................... 365/226, 225.7; 327/143, 198, 270

(56) References Cited

U.S. PATENT DOCUMENTS

| Re. 35,825 | | 6/1998 | Zagar | 365/226 |
|---|---|---|---|---|
| 4,585,955 | * | 4/1986 | Uchida | 307/297 |
| 5,235,550 | | 8/1993 | Zagar | 365/226 |
| 5,469,099 | * | 11/1995 | Konishi | 327/198 |
| 5,644,546 | * | 7/1997 | Furumochi et al. | 365/226 |
| 6,104,221 | * | 8/2000 | Hoon | 327/143 |
| 6,108,246 | * | 8/2000 | Umezawa et al. | 365/189.09 |

* cited by examiner

Primary Examiner—Richard Elms
Assistant Examiner—Anh Phung
(74) Attorney, Agent, or Firm—Dickstein Shapiro Morin & Oshinsky LLP

(57) ABSTRACT

A low voltage power-up detection circuit for use includes a programmable resistance biasing network which provides an adjustable voltage to vary a power-up voltage detection point. The programming of the bias network can be set during testing of the device. The low voltage power-up detection circuit may be used with many devices including memory devices such as DRAMs.

39 Claims, 4 Drawing Sheets

LOW VOLTAGE LEVEL POWER-UP DETECTION CIRCUIT

FIELD OF THE INVENTION

The present invention relates to power-up detection circuits which have utility in a wide variety of integrated circuit structures, and particularly for detecting a power-up condition in a memory device.

DISCUSSION OF THE RELATED ART

FIG. 1 depicts a conventional power-up detecting circuit for use in a memory device such as a DRAM. The FIG. 1 circuit indicates a power-up condition when applied Vcc reaches a predetermined value. It includes a differential amplifier 11 which is connected to receive at a negative input a voltage provided at a drain of a transistor 13, the latter of which is connected to ground through a resistance 15. The source terminal of the transistor 15 is connected to Vcc. The positive input of differential amplifier 11 is connected to node A which is also connected to the gate of transistor 13.

Node A is also at the junction of a resistor 19 and a transistor 17, the latter of which is connected as a diode. In operation, when the voltage Vcc is first applied and begins to rise, the voltage at node A between resistor 19 and transistor 17 likewise begins to rise until transistor 13 turns on, clamping the voltage of node A at a Vt. Resistor 15 holds node B at ground until Vcc is a Vt above node A. Once Vcc is greater than a Vt above node A, transistor B turns on charging node B to Vcc. When the voltage at node B crosses the voltage of node A, amplifier 11 switches state and provides a power-up output signal. This is illustrated in FIG. 4 as the crossing point of the node A and node B voltage curves. Note that in FIG. 4, node B charges to Vcc. The instantaneous value of Vcc where switching occurs is typically at Vcc minus the additive threshold voltages Vt of transistors 13 and 17, e.g., Vcc−2 Vt.

Although the FIG. 1 circuit works adequately in detecting a power-up condition for higher values of Vcc, the 2 Vt voltage drop detection point is too high for low voltage Vcc values. Many memory devices, e.g. DRAMS, are now beginning to operate at approximately 1.8 volts. Accordingly, the use of transistors 17 and 13 to set the switching threshold point at 2 Vt does not allow for sufficient variability to accommodate different low levels of operating voltage Vcc. Accordingly, a more versatile power-up circuit is needed.

SUMMARY OF THE INVENTION

The present invention is directed to a power-up detection circuit for integrated circuit devices, for example, memory devices such as DRAMS, in which the threshold switching voltage point can be adjusted without regard to a fixed voltage drop set by a transistor or diode, and in which a power-on condition can be detected at a selected one of a plurality of operative voltage levels. A programmable resistor network is used in the detection circuit to establish the switching voltage point. Various resistors of the resistor network can be selectively made operative or inoperative in accordance with a set pattern programmed into the resistance network.

BRIEF DESCRIPTION OF THE DRAWINGS

These and other features of the invention will become more apparent from the following detailed description which is provided in connection with the accompany drawings in which.

DETAILED DESCRIPTION OF PREFERRED EMBODIMENTS

Figure 2:
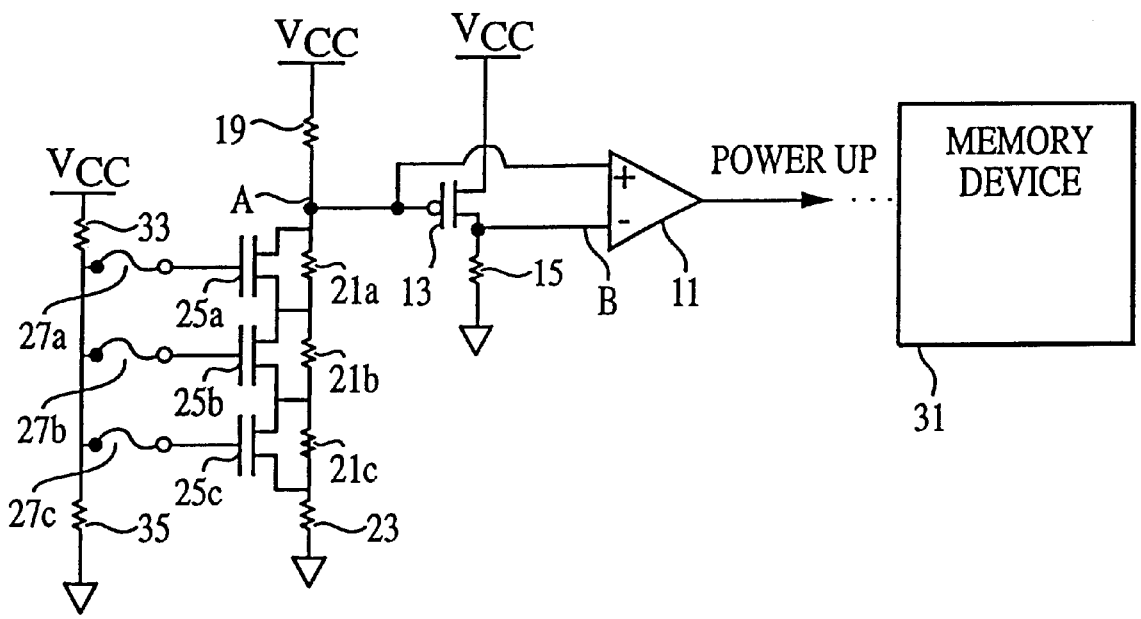
FIG. 2 illustrates a power-up detection circuit in accordance with an exemplary embodiment of the present invention.

FIG. 2 illustrates an exemplary embodiment of the invention. As shown, the invention has particular utility as a power-up detection circuit for a memory device 31 which includes a memory array and access circuitry for reading data from and writing data into said array. A power-up detection signal is supplied to a power-up detection terminal of memory device 31. Although FIG. 2 shows a memory device 31, it should be understood that the present invention also has applicability to any other circuit structure, including but not limited to any integrated circuit structure, where it is necessary to determine a power-up condition.

Figure 1:
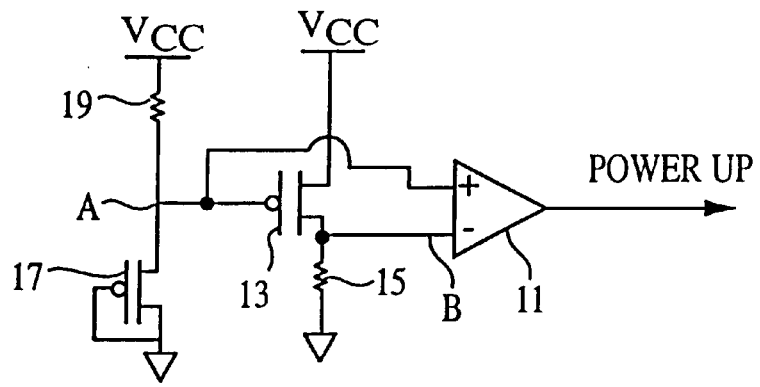
FIG. 1 illustrates a conventional power-up detection circuit.

The structure of FIG. 2 is similar to that of FIG. 1, except the transistor 17 has been replaced by a resistor network which includes serially connected resistors 21a, 21b, 21c and 23. These resistors form a resistance divider with resistor 19 to provide a voltage to the gate of transistor 13 at node A.

The resistors 21a, 21b and 21c can be selectively shunted by respective transistors 25a, 25b, 25c, thereby providing a programming capability for the resistor network. It should be noted that although three resistors and associated transistors are illustrated in FIG. 2, any number of resistors and associated transistors may be used as desired.

The transistors 25a . . . 25c used to selectively shunt a respective resistor 21a . . . 21c are connected to respective programmable elements 27a . . . 27c. These programmable elements are, in turn, connected to the junction of resistors 33 and 35, which form a resistance divider connected between Vcc and ground to thereby derive a programming voltage from Vcc. The programming voltage is applied through the respective programmable elements 27a . . . 27c to the gates of transistors 25a . . . 25c to turn the transistors 25a . . . 25c on. The programmable elements 27a . . . 27c selectively establish a connection to the programming voltage for transistors 25a . . . 25c and therefore control the selective shunting of resistors 21a . . . 21c.

In this manner, the overall resistance of the resistance network formed by resistors 21a . . . 21c can be programmably adjusted. Programmable elements 27a . . . 27c can be formed as programmable fuses or programmable anti-fuses during manufacture of the integrated circuit containing the FIG. 2 power-up circuit.

With the circuit of FIG. 2, the voltage which is applied to the gate of transistor 13 can be selected by the selective programming of programmable elements 27a . . . 27c to select the switching voltage at which amplifier 11 will switch. The applied voltage to gate 13 does not depend on the voltage drop of a transistor or other active device, and therefore can be made variable without being limited by voltage drops associated with an active device, such as the transistor 17 of FIG. 1.

FIG. 2 illustrates negative and positive inputs of differential amplifier 11 respectively connected to the drain and gate of transistor 13. It is also possible, however, to use the invention with only a single connection of the amplifier 11 to the drain of transistor 13 and using a fixed voltage at the other amplifier 11 input. In either case, the amplifier 11 will change output state when the voltage Vcc applied to the power-up circuit reaches a preselected magnitude at which transistor 13 turns on to indicate a power-up condition.

The invention has particular utility in tuning a power-up detecting circuit during a testing phase, at which time the resistor network formed by resistors 21a . . . 21c can be programmed in accordance with a desired detection characteristic for the power-up detection circuitry. The value of resistors 21a . . . 21c can be selected to provide coarse and fine adjustments of the Vcc signal level at which amplifier 11 switches to indicate a power-up condition. This can be particularly useful when trimming the operation of the power-up circuit during a circuit testing mode.

Figure 3:
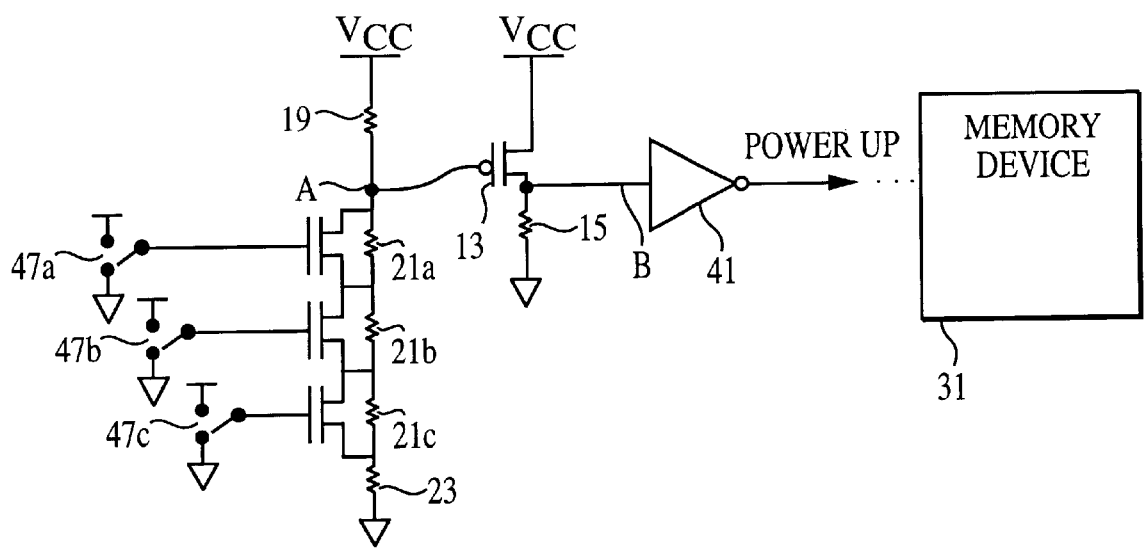
FIG. 3 illustrates a power-up detection circuit in accordance with an another embodiment of the present invention.

Further, as shown in FIG. 3, an inverter 41 could be used in place of the amplifier 11 and the programmable elements 27a . . . 27c could be replaced with switches 47a . . . 47c.

Figure 4:
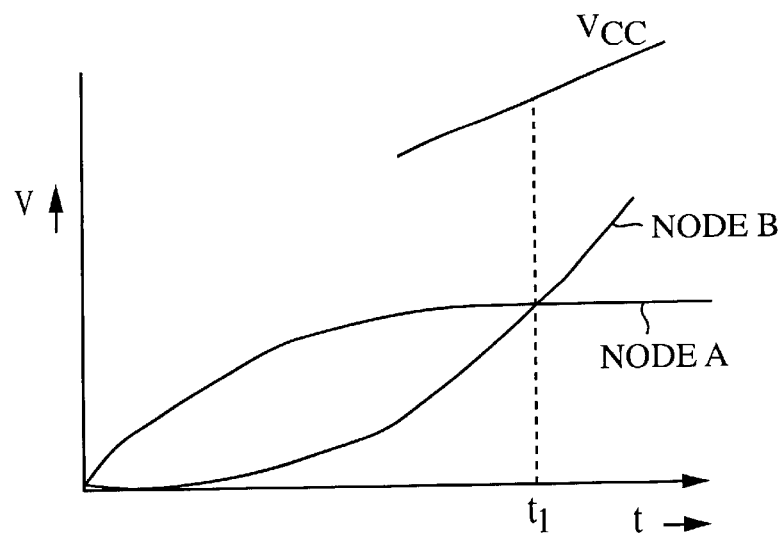
FIG. 4 illustrates operation of the FIG. 1 circuit.
Figure 5:
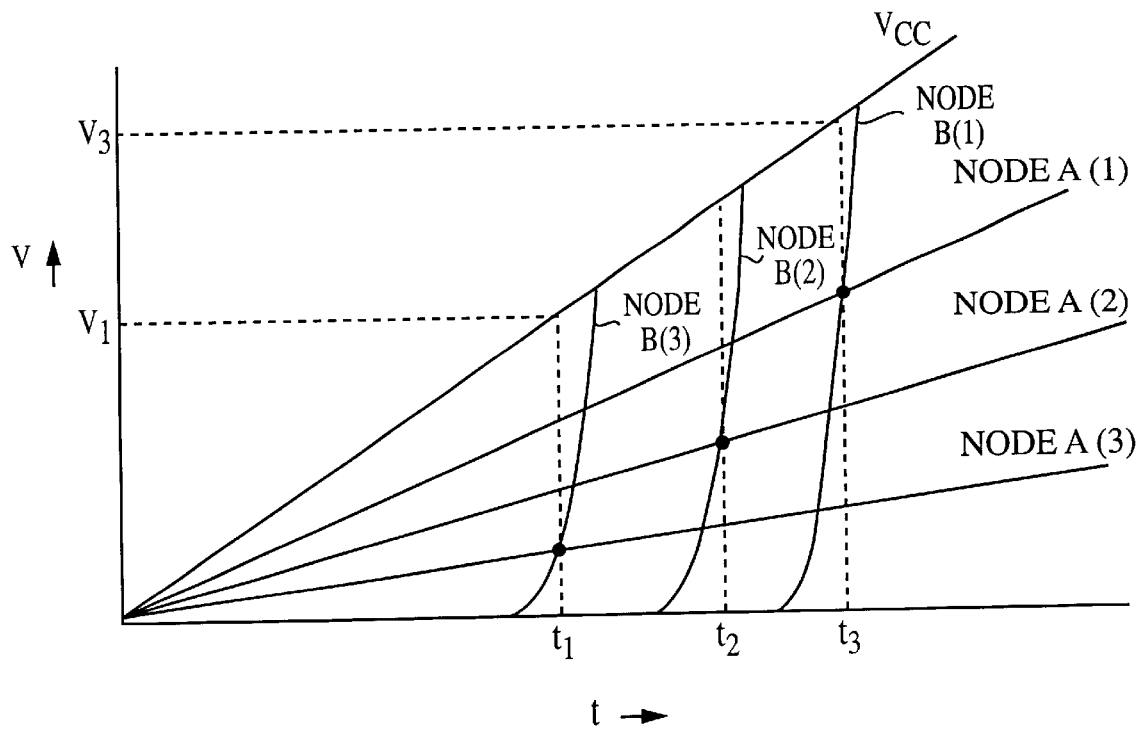
FIG. 5 illustrates operation of the FIG. 2 circuit.

The manner of operation of the invention as depicted in the exemplary embodiment of FIG. 2, compared with the conventional circuit illustrated in FIG. 1, is shown with reference to FIGS. 4 and 5.

FIG. 4 illustrates the operation of the conventional FIG. 1 circuit. The node A and B voltages are illustrated. As shown, as the voltage in node A begins to increase as the voltage Vcc is applied, there is a lag before transistor 13 turns on and the voltage at node B charges to Vcc. Switching of amplifier 11 occurs when the node B voltage equals the node A voltage, which corresponds to an instantaneous Vcc voltage equal to the final Vcc–2Vt, where Vt is the threshold voltage of each of transistors 17 and 13. As shown, the circuit of FIG. 1 has a minimum trip point of 2 Vt.

By contrast, FIG. 5 illustrates a plurality of node A voltages which are now linear. Each of the linear voltage graphs represents a different resistance value caused by the shunting of various ones of resistors 21a, 21b, 21c. As illustrated, by adjusting which of the resistors 21a . . . 21c is shunted, the turn-on characteristics of transistor 13 are, in effect, adjusted within an adjustment range $V_1$ to $V_3$ which allows for power-up detection to occur at a selected instantaneous Vcc voltage value within a range of instantaneous Vcc voltages. Thus, the FIG. 2 circuit provides more flexibility in setting the power-up detecting circuit initially, for example, during a testing phase, and for detection at various levels of Vcc during its power-up phase. In addition, the FIG. 2 circuit permits trimming the voltage switch point to a precise value during the testing of a circuit containing the FIG. 2 power-up detection circuit.

Figure 6:
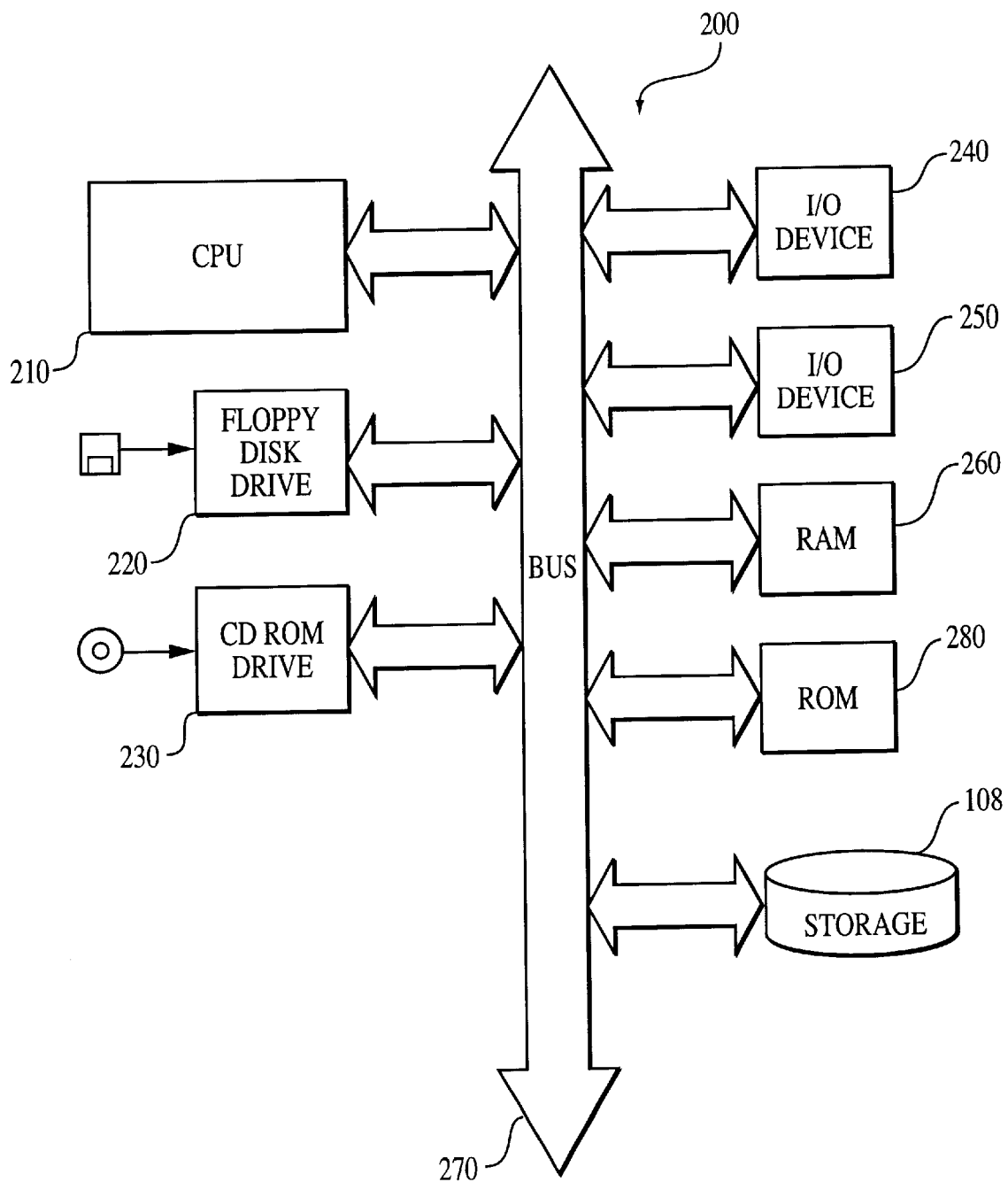
FIG. 6 illustrates use of the invention in a processor system.

FIG. 6 illustrates a processor system which employs the invention. As shown in FIG. 6, a processor system, such as a computer system, for example, generally contains a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least one of CPU 210, RAM 260 and ROM 280, are preferably constructed as integrated circuits which include a power-up detection circuit as previously shown and described with respect to FIGS. 2 and 4. It may also be desirable to integrate the processor 210 and memory 260 on a single IC chip and have one or both of processor 210 and memory 260 employ the power-up detection circuit shown and described with reference to FIGS. 2, 3, and 5.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A power-up detection circuit comprising:
   a transistor for providing a voltage output signal when a first voltage is applied to a supply terminal, said transistor having a gate for receiving a second voltage generated from said first voltage; and
   a biasing circuit for applying said second voltage to said gate, said biasing circuit being connected to receive said first voltage from said terminal and including a resistance circuit for dividing said first voltage applied to said terminal to produce said second voltage;
   wherein said resistance circuit is variable for providing different voltage levels for said second voltage.

2. A circuit as in claim 1 wherein said resistance circuit comprises a programmable resistance network.

3. A circuit as in claim 2 wherein said programmable resistance network comprises a plurality of connected resistors and a plurality of transistor switches, said transistor switches being selectively operated to alter which of said resistors are electrically operable in said resistance network to thereby change said second voltage.

4. A circuit as in claim 3 wherein said plurality of resistors are connected in series and said transistor switches are respectively associated with said resistors such that when a transistor switch is turned on a respective resistor is shunted.

5. A circuit as in claim 3 further comprising a plurality of programmable elements respectively associated with said transistor switches, a transistor switch being rendered operative not depending on the programmed state of a respective programmable element.

6. A circuit as in claim 5 wherein said programmable elements are fuses connected between a third voltage and a gate of a respective transistor switch.

7. A circuit as in claim 5 wherein said programmable elements are anti-fuses connected between a third voltage and a gate of a respective transistor switch.

8. A circuit as in claim 6 or 7 wherein said third voltage is derived from said first voltage.

9. A circuit as in claim 1 further comprising an amplifier having at least one input connected to receive said voltage output signal and for providing a power-up detection output signal.

10. A circuit as in claim 9 wherein said amplifier is a differential amplifier and at least one input of said differential amplifier is connected to receive said voltage output signal.

11. A circuit as in claim 10 wherein said differential amplifier has one input connected to receive said voltage output signal and another input connected to receive a voltage taken from a gate of said transistor.

12. A memory device comprising:
   a memory circuit including a memory array and an access circuit for reading data from and writing data into said array; and a memory circuit power-up detection circuit comprising:
  a transistor for providing a voltage output signal when a first voltage is applied to a supply terminal, said transistor having a gate for receiving a second voltage generated from said first voltage; and
  a biasing circuit for applying said second voltage to said gate, said biasing circuit being connected to receive said first voltage from said terminal and including a resistance circuit for dividing said first voltage applied to said terminal to produce said second voltage;
    wherein said resistance circuit is variable for providing different voltage levels for said second voltage.

13. A memory device as in claim 12 wherein said resistance circuit comprises a programmable resistance network.

14. A memory device as in claim 13 wherein said programmable resistance network comprises a plurality of connected resistors and a plurality of transistor switches, said transistor switches being selectively operated to alter which of said resistors are electrically operable in said resistance network to thereby change said second voltage.

15. A memory device as in claim 14 wherein said plurality of resistors are connected in series and said transistor switches are respectively associated with said resistors such that when a transistor switch is turned on a respective resistor is shunted.

16. A memory device as in claim 14 further comprising a plurality of programmable elements respectively associated with said transistor switches, a transistor switch being rendered operative not depending on the programmed state of a respective programmable element.

17. A memory device as in claim 16 wherein said programmable elements are fuses connected between a third voltage terminal and a gate of a respective transistor switch.

18. A memory device as in claim 16 wherein said programmable elements are anti-fuses connected between a third voltage and a gate of a respective transistor switch.

19. A memory device as in claim 17 or 18 wherein said third voltage is derived from said first voltage.

20. A memory device as in claim 12 further comprising an amplifier having at least one input connected to receive said voltage output signal and for providing a power-up detection output signal.

21. A memory device as in claim 20 wherein said amplifier is a differential amplifier and at least one input of said differential amplifier is connected to receive said voltage output signal.

22. A memory device as in claim 21 wherein said differential amplifier has one input connected to receive said voltage output signal and another input connected to receive a voltage taken from a gate of said transistor.

23. A processor system comprising:
  a processor; and
  a memory device coupled to said processor, said memory device comprising:
    a memory circuit including a memory array and an access circuit for reading data from and writing data into said array; and
    a memory circuit power-up detection circuit comprising:
      a transistor for providing a voltage output signal when a first voltage is applied to a supply terminal, said transistor having a gate for receiving a second voltage generated from said first voltage; and
      a biasing circuit for applying said second to voltage to said gate, said biasing circuit being connected to receive said first voltage from said terminal and including a resistance circuit for dividing said first voltage applied to said terminal to produce said second voltage;
        wherein said resistance circuit is variable for providing different voltage levels for said second voltage.

24. A processor system as in claim 23 wherein said resistance circuit comprises a programmable resistance network.

25. A processor system as in claim 24 wherein said programmable resistance network comprises a plurality of connected resistors and a plurality of transistor switches, said transistor switches being selectively operated to alter which of said resistors are electrically operable in said resistance network to thereby change said second voltage.

26. A processor system as in claim 25 wherein said plurality of resistors are connected in series and said transistor switches are respectively associated with said resistors such that when a transistor switch is turned on a respective resistor is shunted.

27. A processor system as in claim 25 further comprising a plurality of programmable elements respectively associated with said transistor switches, a transistor switch being rendered operative not depending on the programmed state of a respective programmable element.

28. A processor system as in claim 27 wherein said programmable elements are fuses connected between a third voltage terminal and a gate of a respective transistor switch.

29. A processor system as in claim 27 wherein said programmable elements are anti-fuses connected between a third voltage terminal and a gate of a respective transistor switch.

30. A processor system as in claim 28 or 29 wherein said third voltage is derived from said first voltage.

31. A processor system as in claim 23 further comprising an amplifier having at least one input connected to receive said voltage output signal and for providing a power-up detection output signal.

32. A processor system as in claim 31 wherein said amplifier is a differential amplifier and at least one input of said differential amplifier is connected to receive said voltage output signal.

33. A processor system as in claim 32 wherein said differential amplifier has one input connected to receive said voltage output signal and another input connected to receive a voltage taken from a gate of said transistor.

34. A method of detecting a power-up condition of a circuit, said method comprising:
  adjusting a resistance network which is coupled to a voltage supply terminal, which is adapted to receive a first voltage, to produce an adjusted second voltage from an applied said first voltage; and
  using said adjusted second voltage to produce a signal indicating a power up condition;
    wherein said adjusting further comprises setting a resistance value in an adjustable resistance network which divides said first voltage.

35. A method as in claim 34 wherein said setting comprises programming a resistance value for said resistance network.

36. A method as in claim 35 wherein said resistance network comprises a plurality of resistors and said programming determines which of said resistors are operative in said resistance network.

37. A method as in claim 36 wherein said programming permits one or more of said resistors to be selectively inoperative in said resistance network.

38. A method as in claim 36 wherein said adjusting occurs during a testing operation of said circuit.

39. A method of detecting a power-up condition of a memory device, said memory device having a power-up terminal for receiving a power-up indication signal, said method comprising:

operating a transistor to produce a voltage output signal when a first voltage is applied to a supply terminal, said transistor receiving second voltage at a gate terminal which is generated from said first voltage;

receiving said first voltage at a resistance divider circuit and producing said second voltage from said first voltage;

adjusting the resistance of said resistance divider circuit by setting a resistance value in an programmable resistance network to produce a predetermined value of said second voltage; and using said voltage output signal to generate a power-up signal at said power-up terminal.

* * * * *